United States Patent
Jabbari et al.

(10) Patent No.: US 6,925,478 B2
(45) Date of Patent: Aug. 2, 2005

(54) PRACTICAL PSEUDO-ASYNCHRONOUS FILTER ARCHITECTURE

(75) Inventors: Alireza Jabbari, Berkeley, CA (US); David P Stumbo, Belmont, CA (US); Michael Sogard, Menlo Park, CA (US)

(73) Assignee: Nikon Corporation, Tokyo (JP)

( * ) Notice: Subject to any disclaimer, the term of this patent is extended or adjusted under 35 U.S.C. 154(b) by 719 days.

(21) Appl. No.: 09/739,331

(22) Filed: Dec. 19, 2000

(65) Prior Publication Data

US 2002/0120656 A1 Aug. 29, 2002

(51) Int. Cl.$^7$ .............................................. G06F 17/10
(52) U.S. Cl. ..................................................... 708/313
(58) Field of Search ................................ 708/300, 313

(56) References Cited

U.S. PATENT DOCUMENTS

| | | | |
|---|---|---|---|
| 4,453,259 A | 6/1984 | Miller | 375/106 |
| 5,315,621 A | 5/1994 | Lucioni et al. | 375/103 |
| 5,367,545 A | 11/1994 | Yamashita et al. | 375/118 |
| 5,524,124 A | 6/1996 | Koenig | 375/229 |
| 5,596,609 A | 1/1997 | Genrich et al. | 375/350 |
| 5,701,261 A | 12/1997 | Evans | 364/124.1 |
| 5,703,904 A | 12/1997 | Langberg | 375/232 |
| 5,784,166 A | 7/1998 | Sogard | 356/363 |
| 5,786,778 A * | 7/1998 | Adams et al. | 341/61 |
| 5,872,480 A * | 2/1999 | Huang | 329/304 |
| 6,014,682 A * | 1/2000 | Stephen et al. | 708/313 |
| 6,061,410 A * | 5/2000 | Linz | 375/371 |

* cited by examiner

Primary Examiner—D. H. Malzahn
(74) Attorney, Agent, or Firm—Finnegan, Henderson, Farabow, Garrett & Dunner, LLP (57) ABSTRACT

A system and methods for generating a variable rate filtered output using synchronous filters having the same filter sampling time, that avoids complexities of asynchronous filters. A system employs multiple filters that are staggered in time and set so that the output of one of the multiple filters is available whenever a secondary process requires state information. In another embodiment, the synchronous filters are programmable so as to change the filter sampling time. This configuration is possible when it is known that the prescribed time interval of the secondary process is longer than the filter sampling time and the prescribed time interval is an integer multiple of the filter sampling time. By using programmable filters, the number of filters required to accommodate a certain prescribed time interval can be minimized. Whether a system employs multiple non-programmable filters staggered in time or programmable filters, the invention achieves producing a variable rate filtered output while using synchronous filters. Thus, computationally intensive and complicated variable rate filters can be avoided while minimizing processor requirements. In another aspect of the invention, the inventive method of generating a variable rate filtered output is employed in a lithography system to control the movements of various components therein. In one embodiment, the filtered outputs are used to estimate the relative positions of the reticle and the wafer. With the variable rate feature, the lithography system can dynamically accommodate for the noise arising from component movements and other sources in the wafer exposure process.

28 Claims, 10 Drawing Sheets

PRACTICAL PSEUDO-ASYNCHRONOUS FILTER ARCHITECTURE

FIELD OF THE INVENTION

The invention relates to the field of filters, and more particularly to digital filters that can produce an output at a variable rate.

BACKGROUND OF THE INVENTION

Asynchronous digital filters are used in many applications, including navigation, process control and machine calibration. Asynchronous filters provide a filtered output of an input signal at a variable rate, hence the asynchronous appellation (i.e., filter output is available on demand). In contrast, synchronous filters provide a filtered output at a constant rate. In the area of position control, for example, the input signal to the filter may be a sensor sample that is a measurement of velocity, position, rotational rate or angle of a spinning vehicle or body. The filter output gives an indication of the orientation or trajectory of the vehicle or body. The orientation or the trajectory of a body is often described by a fixed number of variables defined as the state of the system being observed.

Typically, an asynchronous filter receives at least one sensor sample during its time period and produces a filtered output for use by a secondary process or system. The secondary process or system may be a control system that uses the state of the system, as indicated by the filter output, to either change the state of the system or to compensate for perturbations in the state. For example, the control system of a missile or a robot arm will correct for inaccuracies between the desired trajectory and the actual trajectory as indicated by the filter output. In other applications, the filter may give an indication of other system states and the control system may perform other functions.

Filtering is necessary because measurement of physical phenomena (e.g., position, velocity, acceleration and pressure) usually results in a signal that is corrupted by noise and other sources of deviations from the actual measurement desired. The secondary process typically cannot meaningfully use noisy sensor samples. However, if the statistical properties of the noise are known, a filter can be designed to produce a more accurate estimate of the system states based on the noise-corrupted state measurements. In addition to filtering the measured signal, certain corrections and transformations of the state estimates, such as coordinate transformations, may also be made by the filter.

The variable rate feature of asynchronous filters is highly desirable because in many applications the rate at which the secondary system desires the filter output may not be constant. Furthermore, the window during which the secondary process may accept information from the filter may be restricted. As the process changes, the secondary system, which may need to make determinations about the state of the system or adjustments more often, may require more frequent and accurate updates from the filter. If a filter generates outputs at a fixed rate, the secondary system may make determinations or adjustments that are based on older and less accurate information. Consequently, a variable rate or asynchronous filter is highly desirable because it provides a filter output based on more recent sensor samples and provides a filter output that can be used by the secondary system at the time the secondary system needs the filter output, thus reducing data age. To further reduce the effects of data age, prediction may be used to extend the filtered signal into the future. Providing a filter output at or close to the time that the secondary system needs the filter output shortens the prediction time, thereby reducing the errors.

Asynchronous digital Kalman filters are one type of asynchronous digital filter. More details on asynchronous Kalman filters can be found in *Applied Optimal Estimation* by Arthur Gelb, MIT Press, Cambridge, Mass., 1974. Kalman filters have many desirable properties including optimality, recursive solutions, and ease of digital implementation. Unfortunately, asynchronous Kalman filters are typically very complicated and, consequently, computationally intensive and slow. The intensive computational requirements of an asynchronous Kalman filter will limit the maximum sampling frequency. As a result, the asynchronous filter may be unable to produce an output at a rate necessary for the secondary process.

Synchronous Kalman filters are simpler to design and less computationally intensive, hence they are faster. More details on synchronous Kalman filters can be found in *Adaptive Filtering: Prediction and Control* by Graham C. Goodwin and Kwai Sang Sin, Prentice-Hall, Inc., Englewood Cliffs, N.J. Unfortunately, a single synchronous Kalman filter is not well suited to applications that require filtered output at a variable rate. Consequently, there is a need for synchronous filters, whether of a Kalman or another type, to produce filtered output at a variable rate. The invention meets this need.

In some lithography systems, radiation from a source exposes specific areas of a wafer, that is coated with a resist sensitive to the radiation, as the wafer travels relative to the source. In this manner, a desired pattern is exposed in the resist on the wafer. The exactness of the movement of the wafer beneath the radiation source is therefore critical. It is desirable to have a control system that obtains exact state updates of the wafer as it travels relative to the radiation source. As information about the path traversed by the wafer is sampled, the signal including the measurement samples includes noise and other sources of deviations. Since statistical properties of some noise and deviations are known, filters are used to produce a more accurate estimate of the actual position based on the noisy measurement sample. In essence, the filter acts to "remove" such characterized noises and deviations. The invention provides an approximately asynchronous filter for more accurately correcting the errors associated with the motion of various components in lithography systems. Such an asynchronous filter is essential in a system where the corrections are made by a subsystem that can only accept data during a small window of time, and this window does not occur at a fixed rate. The filter, in addition to signal processing, may also use prediction to compensate for delays, and may also perform deterministic corrections and transformations on the sensor data and/or the state estimates.

SUMMARY OF THE INVENTION

A system and methods that provide a simple effective technique for generating variable rate filtered output while using synchronous filters having the same fixed filter update time are described. The system employs multiple filters having outputs are staggered in time. The amount by which each filter is staggered in time is set so that the output of one of the multiple filters is available whenever a secondary process requires state information.

In another embodiment, the synchronous filters are programmable so as to change the filter update time. This configuration is possible when it is known that the frequency at which the secondary process requires data from the filter (the input frequency) is smaller than the filter update frequency and the filter update frequency is an integer multiple of the input frequency. By using programmable filters, the number of filters required to accommodate the data requirements of the secondary process can be minimized.

Whether a system employs multiple non-programmable filters staggered in time or programmable filters, the invention achieves a variable rate filtered output while using synchronous filters. Thus, computationally intensive and complicated variable rate filters can be avoided, while at the same time minimizing processor requirements.

In another aspect of the invention, a method of generating a variable rate filtered output is employed in a lithography system to control the movements of various components therein. In one embodiment, the filtered outputs are used to estimate the position of the wafer stage. With the variable rate feature, the lithography system, in which the correction subsystem can only accept stage state information within restricted windows in time and the rate at which these windows occur is not constant, can dynamically correct for the position errors in the stage during the wafer exposure process.

DETAILED DESCRIPTION OF THE PREFERRED EMBODIMENT

Figure 1:
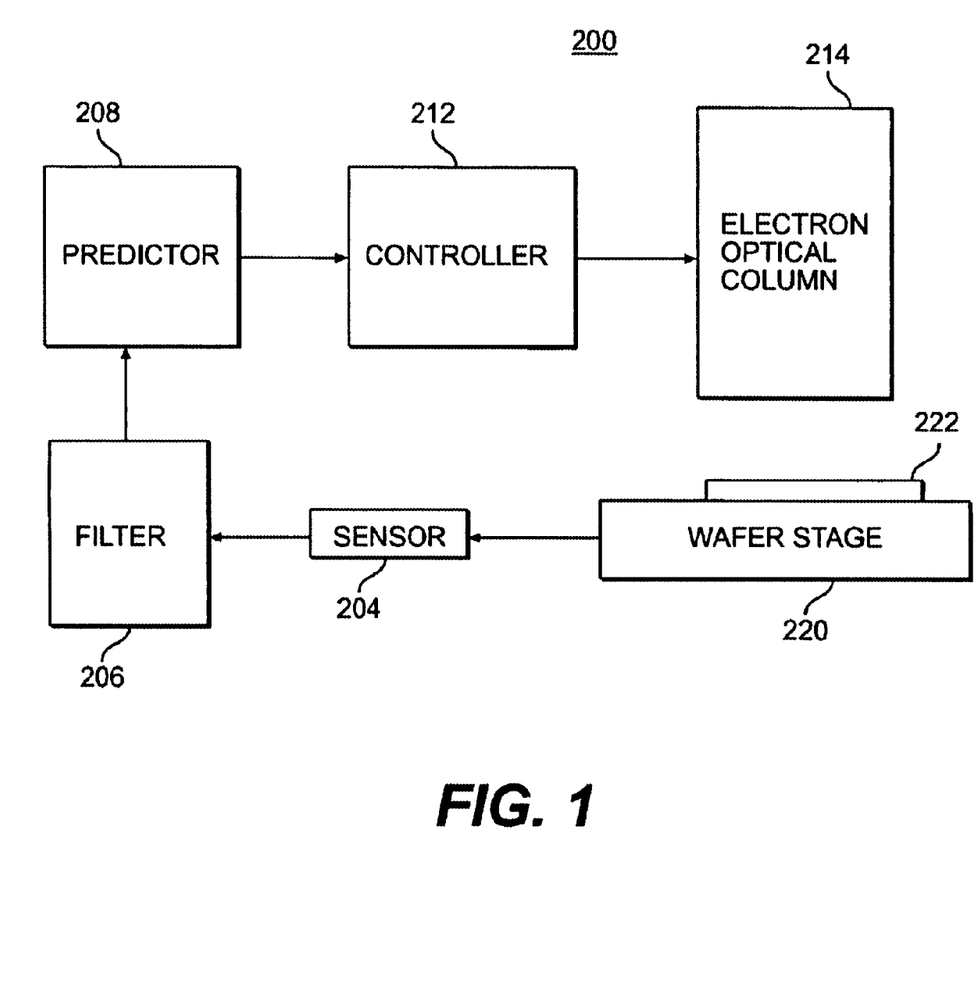
FIG. 1 is a block diagram of a lithography system according to the presently preferred embodiment of the invention.

FIG. 1 shows a system block diagram of an electron beam lithography system (System) 200 according to the presently preferred embodiment of the invention. System 200 includes a moving stage 220 that carries a resist-coated wafer 222 for exposure by an electron optical column 214. System 200 also includes a sensor 204 that measures the position of the wafer stage 220. The sensor 204 is coupled to a filter 206. The filter 206 is connected to a predictor 208 that in turn is connected to a controller 212. The controller 212 is connected to the electron optical column 214. The filter 206 and the predictor 208 are shown as separate units in FIG. 1; however, they may also be implemented together as a single unit. A controller (not shown) uses the output of the sensor 204 to control the position of the stage 220.

The filter 206 in the preferred embodiment of the invention is a Kalman filter; however, other filters may be used, such as a lattice filter or a finite impulse response (FIR) filter. In the preferred embodiment, the Kalman filter is implemented using a dedicated digital signal processor (DSP) chip. Although the filter is described as using a dedicated DSP chip, those skilled in the art understand that the invention may be implemented using hardware exclusively or a mixture of software and hardware. Also, the filter, in addition to signal conditioning, may carry out other computations such as coordinate transformation and/or deterministic correction of the state measurements and/or state estimates.

The electron optical column 214 includes an electron source, apertures, and magnetic or electrostatic lenses and deflectors. These elements produce an electron beam at a specified location on the wafer with a well-defined shape and focused in the plane of the wafer. The electron optical column's deflectors control the location of the electron beam at the wafer. The electron optical column also includes a blanking unit that effectively turns the electron beam on or off at the wafer, so that exposure of the wafer by the beam can be controlled. Using the blanker and the deflectors, a pattern can be exposed in the resist coating the wafer surface. After developing the exposed resist, further semiconductor processing operations can be performed on the selectively exposed wafer surface. The electron optical deflectors can only deflect the electron beam over a small fraction of the wafer surface. In order to cover the rest of the surface, the wafer stage must move the wafer in coordination with the electron beam deflectors. The controller 212 controls the deflectors. The invention is preferably directed to a type of electron beam lithography system where the stage moves while the pattern is being written. In order to accurately place the deflected beam on the wafer 222, the controller 212 must have up-to-date information about the wafer stage 220 location. Prior to the start of the wafer exposure procedure, the wafer 222 is rigidly attached to the wafer stage assembly 220 by means of mechanical clamps or an electrostatic chuck. An alignment procedure is then employed to locate previously patterned features on the wafer relative to the wafer stage coordinates and to the electron beam. From that point on, location of the wafer stage assembly 220 can be directly related to the location of features on the wafer 222. Thus, the new pattern being exposed on the wafer can be accurately aligned with respect to structures on the wafer created by earlier lithography operations.

The signals generated by the controller 212 to control the deflectors are analog. However, the processed positional information from the predictor 208 is digital, as is the pattern information sent to the controller by a main computer where the wafer pattern information is stored. Thus, digital-to-analog conversion is required within the controller 212. The analog signals going to the deflectors must be completely free of any noise, as such noise would perturb the pattern placement on the wafer. Therefore, while the electron beam is un-blanked, no digital information can be received by or processed by the controller 212. Digital information can be received by or processed by the controller 212 only when the beam is blanked. Furthermore, the length of time when the beam is un-blanked may vary, depending on the exposure conditions required for the pattern. These conditions require that the filter 206 and the predictor 208 operate in an asynchronous mode. However, if all operations of the system, including the exposure process, can occur in coincidence with transitions of a master clock, or offset in time by a fixed amount from transitions of a master clock, then the filter 206 and the predictor 208 can operate pseudo-asynchronously.

The controller 212 requires up-to-date information about the position of the wafer stage assembly 220 because the precise path of the stage cannot always be known a priori with sufficient accuracy. Ideally, the path traversed by the stage coincides with the path required to place the wafer in the proper location for patterning. However, due to vibrations and inaccuracies in the stage control system, motors and drivers (not shown) of the wafer stage assembly 220, the wafer stage path may deviate from the ideal path, so that the wafer is not in the expected location when the new pattern is being exposed.

This misalignment is unavoidable in normal operation. It can be compensated for by deflecting the electron beam appropriately during the pattern exposure. The amount of deflection required will depend on the relative position error of the wafer stage assembly 220.

The deflection of the electron beam is determined by the controller 212, which provides an analog signal to amplifiers that drive the deflectors within the electron optical column 214. To effect this deflection, the controller 212 is provided with the position error estimates of the wafer stage assembly 220. The position error estimate is generated from a position measurement made by the sensor 204 that detects the position of the wafer stage assembly 220. The sensor 204 may be a heterodyne interferometer system that measures the distance of plane mirrors affixed to the wafer stage assembly from interferometer heads that are fixed in position relative to the electron optical column 214. Such systems are sold commercially by, for example, Hewlett-Packard, and are well known in the art. The output of sensor 204 in that case is a digital signal representing the position of the wafer stage assembly 220. These position measurements are compared to the expected stage position from the stage controller to yield position errors. They are used by the filter 206 to generate relative position error estimates of the wafer stage assembly 220. In a similar manner, stage velocity and acceleration are derived from the position measurements by numerical differentiation, and velocity and acceleration error estimates are determined.

Typically, the signal produced by the sensor 204 includes noise and other sources of deviations (such as quantization). The controller 212 cannot meaningfully use noisy sensor samples. However, if the statistical properties of the noise are known, the filter 206 can be designed to produce a position error estimate of the actual position (or velocity, or acceleration) of the wafer stage assembly 220 using the noisy measurements of the sensor 204. The position error estimate of the filter 206 is likely to be closer to the actual position than that measured by the sensor 204.

Since there typically is a time delay between acquisition of the position information from the sensor 204 and output of the corresponding processed position error estimate by the filter 206, as well as a time lag in sending the filtered signal to the controller 212 and commanding the deflectors to produce the required deflection, a predictor 208 is coupled to the filter 206. Without the predictor 208, the position error estimate from the filter 206 is likely to be inaccurate or "stale" by the time the position error estimate passes from the filter to the controller 212 and on to the deflectors in the form of deflection signals. The predictor 208 supplies information needed by the controller 212 to allow it to provide the correct positional error at the time the deflectors will be deflecting the un-blanked beam.

The predictor 208 takes the filtered errors in position, velocity and acceleration from the filter 206, and generates the future state of the system as follows. If the stage position, velocity and acceleration errors in the directions x and y at the filter 206 update time $t_o$ are defined as $x_0$, $y_0$, $vx_0$, $vy_0$, $ax_0$ and $ay_0$, respectively, then the predicted x and y position errors of the stage at a later time t are approximated by the following expressions:

$$x_p = x_0 + vx_0(t-t_0) + ax_0(t-t_0)^2/2$$

$$y_p = y_0 + vy_0(t-t_0) + ay_0(t-t_0)^2/2$$

Furthermore, the predicted stage velocity errors are given by the following expressions:

$$vx_p = vx_0 + ax_0(t-t_0)$$

$$vy_p = vy_0 + ay_0(t-t_0).$$

The acceleration errors are approximated as constant: $ax_p = ax_0$; $ay_p = ay_0$.

In this example, the stage assembly 220 is assumed to be travelling rectilinearly in the x-y plane. More generally, regarding the stage as a rigid body, the stage position and orientation will require six degrees of freedom to fully define the location of a point on the wafer 222.

After information from the predictor is loaded into the controller 212, it is converted into analog signals that go to the deflector amplifiers. The time between the analog conversion and the filter 206 update time, i.e., $t-t_0$, is substituted into the above equations to provide the quantities $x_p$, $y_p$, $vx_p$, $vy_p$, $ax_p$ and $ay_p$ that are needed by the controller 212. As mentioned above, these quantities must be loaded while the beam is blanked and no exposure is occurring, so that digital noise associated with the data transfer and attendant operations does not perturb the analog deflection signals.

During the exposure, the stage moves a non-negligible distance, requiring the deflectors to be continually updated. Thus, a calculation equivalent to the above must be carried out continuously within the controller 212 using analog techniques and involving the information from the predictor 208.

Since the stage acceleration is generally not constant in time, the above position prediction from the predictor 208 will be valid (i.e., within acceptable accuracy) for only a limited amount of time. Then new values of the quantities $x_0$, $y_0$, $vx_0$, $vy_0$, $ax_0$ and $ay_0$ must be determined from more recent position information from the filter 206. This assumes that the time over which the quantities $x_0$, $y_0$, $vx_0$, $vy_0$, $ax_0$ and $ay_0$ are valid is greater than the time between the filter 206 update time and the conversion of the predicted quantities to analog form in the controller 212. Furthermore, the total beam exposure time may exceed the time during which the quantities $x_0$, $y_0$, $vx_0$, $vy_0$, $ax_0$ and $ay_0$ are valid. In that case, the beam must be blanked, interrupting the exposure, and current values of the quantities $x_0$, $y_0$, $vx_0$, $vy_0$, $ax_0$ and $ay_0$ are used to calculate $x_p$, $y_p$, $vx_p$, $vy_p$, $ax_p$ and $ay_p$, which are then loaded into the controller 212. The exposure can then be continued after the controller 212 has updated the deflector conditions.

Figure 2:
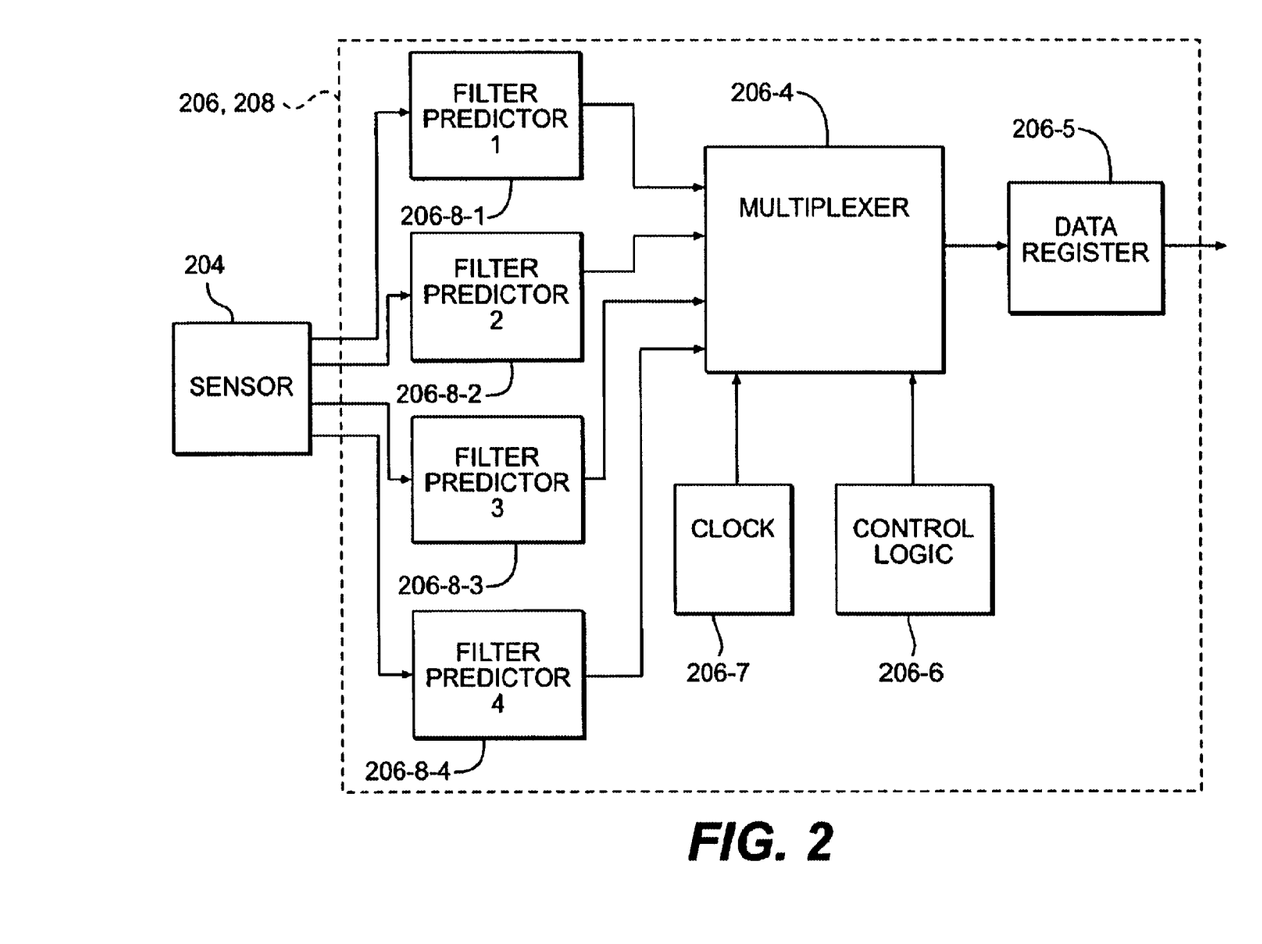
FIG. 2 shows a detailed diagram of a filter and a predictor in accordance with the embodiment of FIG. 2.

FIG. 2 shows a diagram of the filter 206 and the predictor 208 in accordance with the invention. The filter 206 and the predictor 208 can be used to generate position estimates at various rates. In FIG. 2, the filter 206 and the predictor 208 are shown as filter-predictors 206-8-1, 206-8-2, 206-8-3, 206-8-4, each of which performs both filtering and prediction. While in FIG. 2 each filter is shown with a matching predictor, an alternate embodiment may have several filters and only one predictor, provided that the predictor algorithm is fast enough. Each of the filter-predictors 206-8-1, 206-8-2, 206-8-3, 206-8-4 periodically accepts a position measurement sample of the signal generated by the sensor 204. For ease of reference, each filter-predictor combination will be simply described as a filter and will refer to the filter-predictor combination unless explicitly indicated otherwise.

Each of the filters 206-8-1, 206-8-2, 206-8-3, 206-8-4 produces a periodic filtered output using the state measurement samples periodically accepted by each filter. The filters were sequentially initialized, so that their outputs occur during sequential clock pulses. The periodic filtered output produced by each of the filters 206-8-1, 206-8-2, 206-8-3, 206-8-4 is applied to a multiplexer 206-4. A control logic 206-6 and a clock 206-7, which is a system master clock or is synchronized with the system master clock, are each independently coupled to the multiplexer 206-4. The control logic 206-6 generates control signals that are applied to the multiplexer 206-4. At the beginning (or end) of each clock cycle generated by the clock 206-7, or at a fixed time offset, depending on the control signals generated by the logic 206-6, the multiplexer 206-4 selects one or none of the periodic filtered outputs applied at the inputs to the multiplexer 206-4. If the multiplexer 206-4 selects one of the periodic filtered outputs applied at the inputs to the multiplexer 206-4, the multiplexer 206-4 transfers the selected periodic filtered output to the output of the multiplexer 206-4. Over a period of several clock cycles, the output of the multiplexer 206-4 produces an output sequence of state estimates (or filtered state measurement samples) using the periodic filtered outputs accepted by the multiplexer. By manipulating the control signals, the control logic 206-6 can create multiplexer 206-4 output sequences with a variety of frequencies.

Each state estimate produced at the output of the multiplexer 206-4 is stored in a data register 206-5 until it is replaced by the next state estimate produced at the output of the multiplexer 206-4. The state estimate can then be transferred to the controller 212 at an appropriate time while the beam is blanked. From the above information (i.e., $x_p$, $y_p$, $vx_p$, $vy_p$, $ax_p$, $ay_p$, $t-t_p$), the controller 212 can establish the necessary analog signal corrections to the deflectors.

Figure 3:
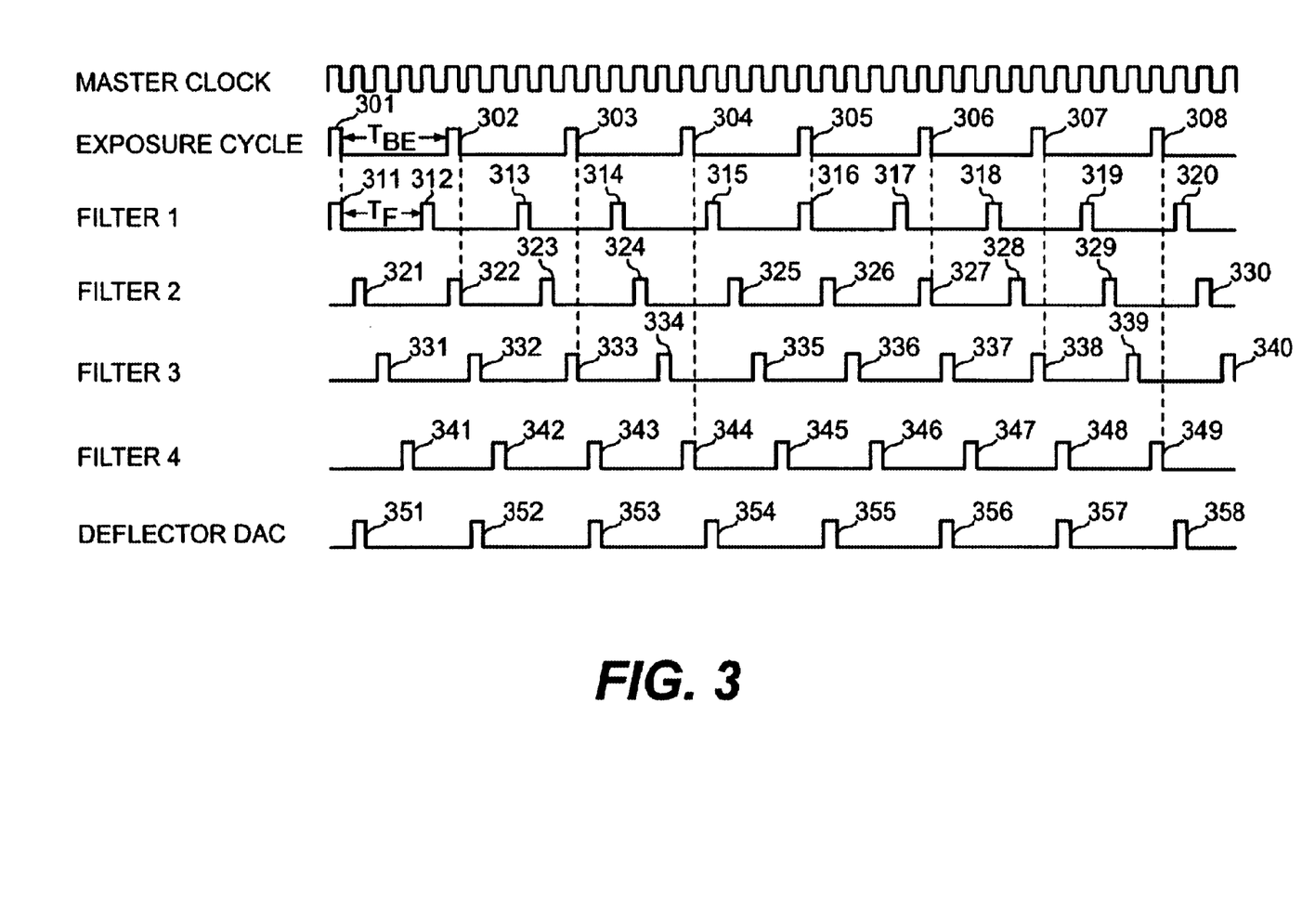
FIG. 3 is a timing diagram of the operation of a synchronous filter architecture according to the embodiment of FIG. 2.
Figure 4:
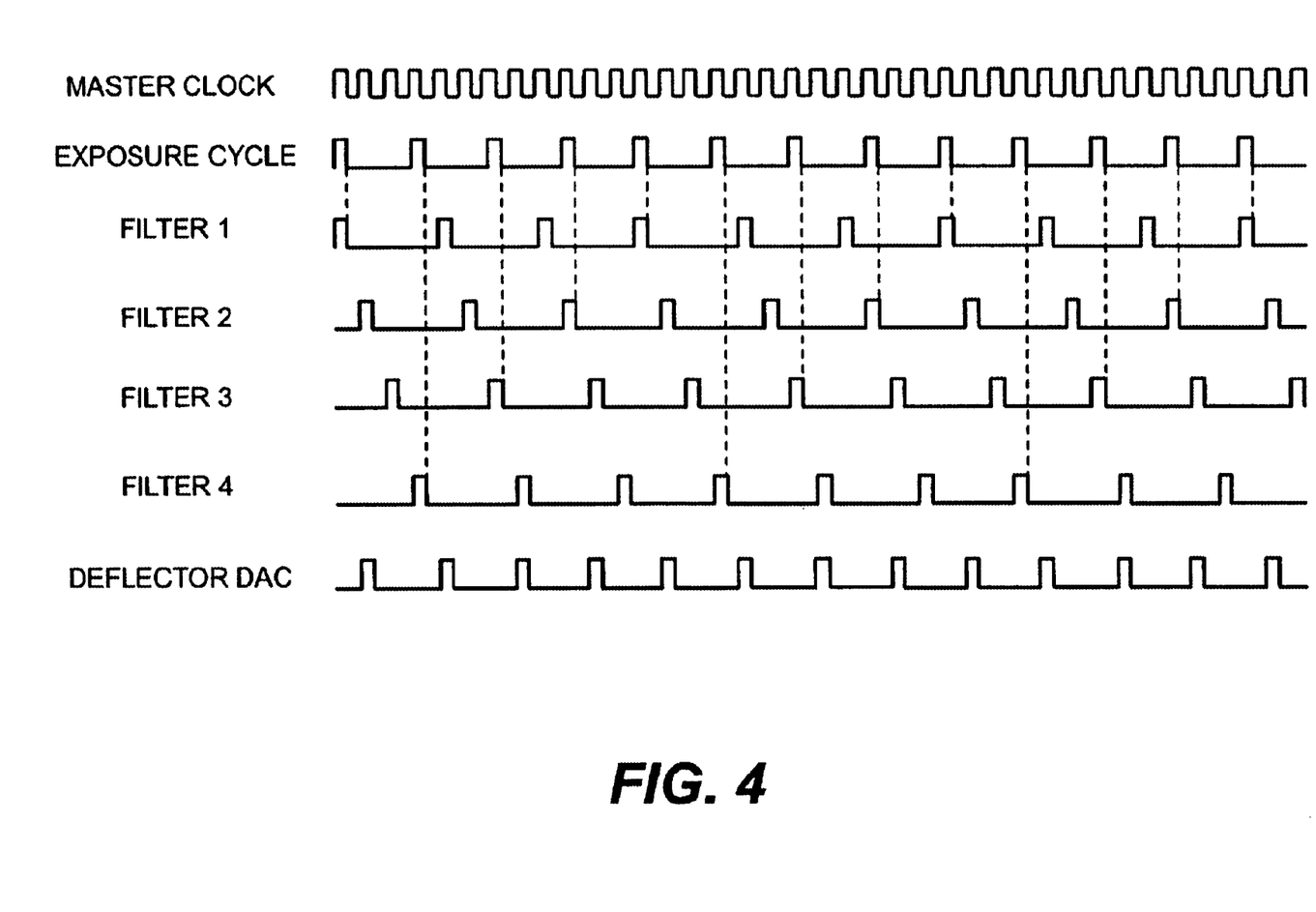
FIG. 4 is a timing diagram of the operation of a synchronous filter architecture according to the embodiment of FIG. 2.
Figure 5:
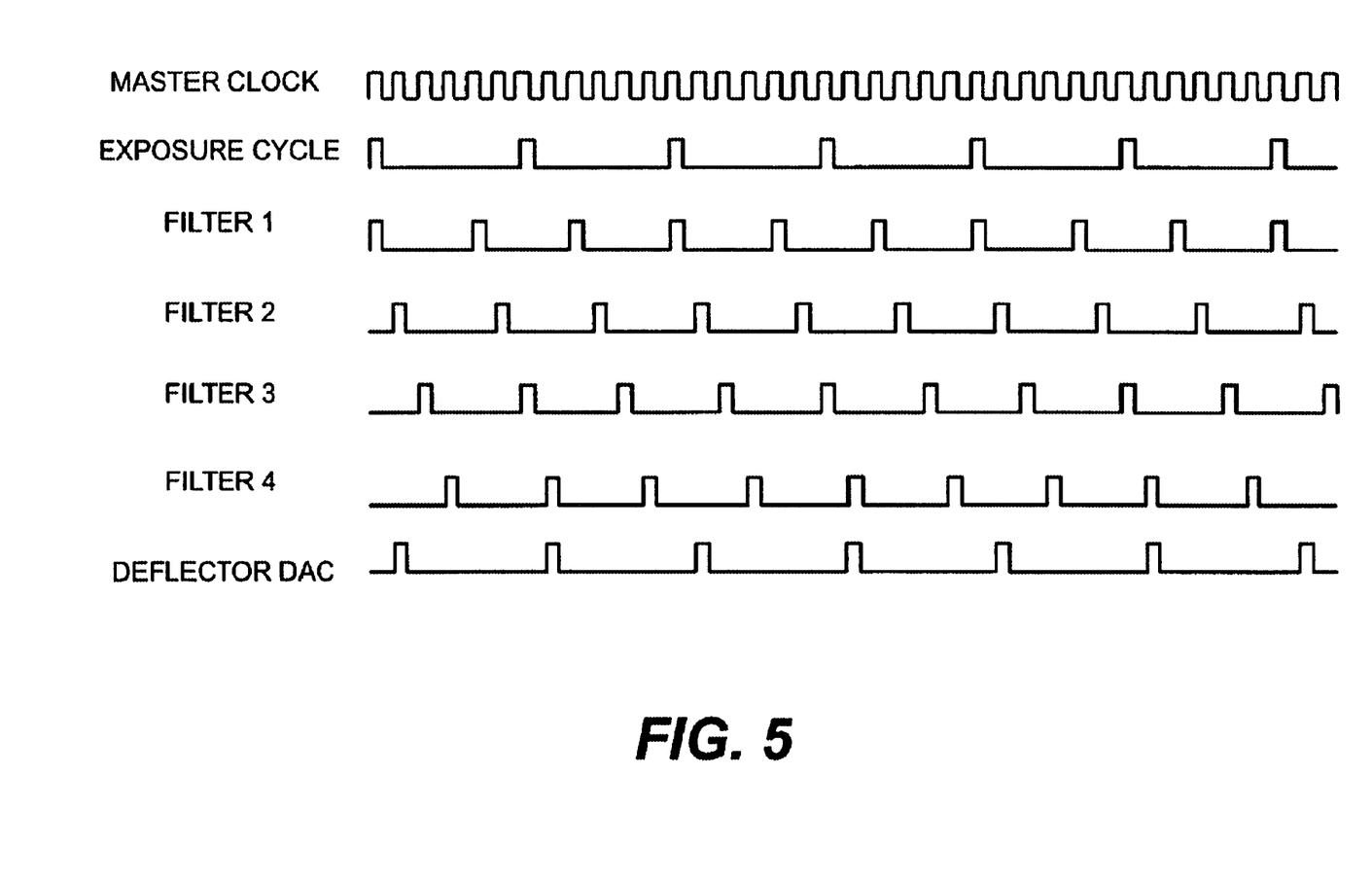
FIG. 5 is a timing diagram of the operation of a synchronous filter architecture according to the embodiment of FIG. 2.

Generation of state estimates at various rates using the embodiment shown in FIG. 2 is readily apparent from the timing diagrams depicted in FIGS. 3, 4 and 5. In FIGS. 3, 4, and 5, the exposure cycle (or input sequence) indicates the frequency and relative timing at which the controller 212 (or secondary process) requires state estimates. In FIG. 3, the exposure cycle has a prescribed time interval $T_{be}$ that is five clock cycles long and includes a blanking period followed by an exposure period. $T_f$ is defined as the filter update time. After the state error predictions are received by the controller 212, the deflector digital-to-analog convertors (DACs) are loaded prior to the analog deflector signal generation. In FIG. 3, the controller 212 requires state estimates every five clock cycles as indicated by the exposure cycles 301-308 that make up the input sequence and that repeat every five clock cycles. In FIG. 4, the controller 212 requires state estimates every three clock cycles. In FIG. 5, the controller 212 requires state estimates every six clock cycles. In each situation depicted by FIGS. 3, 4 and 5, the embodiment shown in FIG. 2 produces the state estimates as needed by the controller 212 even though each of the filters 206-8-1, 206-8-2, 206-8-3, 206-8-4 produces a state estimate every filter update time of four cycles. More specifically, in FIGS. 3, 4, and 5, during each input window, or blanking period, of the exposure cycle, there is a state estimate produced by one of the filters 206-8-1, 206-8-2, 206-8-3, 206-8-4. The multiplexer 206-4, pursuant control signals generated by logic 206-6, selects the state estimate that is coincident with or aligned with the current input window. Alternatively, instead of describing the multiplexer 206-4 as selecting a state estimate, the multiplexer 206-4 can be described as selecting a certain filter for each of the input windows in the input sequence. The control logic 206-7 provides the control signals that cause the multiplexer 206-4 to select from among the state estimates, resulting in the coincidence of the selected state estimates and the input windows for the controller 212. It should be clear that the coincidence, for the purposes discussed herein, may be satisfied when a state estimate is coincident with an input window or when a state estimate is a state estimate that is produced before the start (or rise) time of an input window and that is not so old (stale) or inaccurate as to be useless to the controller 212.

In each of FIGS. 3, 4 and 5, at the same time that a state estimate is produced by a filter, a state measurement sample, that will be used to produce the next state estimate one filter update time later, is accepted by the same filter. However, a given filter is not limited to only this measurement and may use successive as well as earlier measurements in order to calculate its next output. In FIGS. 3, 4 and 5, each of the filters accepts a state measurement sample every four cycles of the master clock, but may not be limited to this one measurement. Filter 206-8-1 accepts its state measurement sample: one clock cycle before filter 206-8-2 accepts its state measurement sample; two clock cycles before filter 206-8-3 accepts its state measurement sample; and three clock cycles before filter 206-8-4 accepts its state measurement sample. In summary, there is one clock cycle between the time any one of the filters accepts its state measurement sample and the nearest time another filter accepts its state measurement sample. It should be apparent that in other representative implementations of this embodiment, the number of clock cycles between the time any one of the filters accepts its state measurement sample and the nearest time at which another filter accepts its state measurement sample may be different. Also, this assumes that the rate at which the sensors can be sampled is fast enough (in the present example, one sample per clock cycle). The above statements also apply to the production of state estimates by the filters.

By using several computationally non-intensive and relatively simple filters, it is possible to provide state estimates over a range of allowable frequencies. Consequently, it becomes possible to avoid variable rate filters that are processor intensive as well as complex to develop.

The state estimates are produced with the same filter update time of four cycles at each of the filters 206-8-1, 206-8-2, 206-8-3, 206-8-4. However, the filters 206-8-1, 206-8-2, 206-8-3, 206-8-4 do not produce the state estimates at the same time. Rather, each filter produces its state estimate at a fixed time period offset from the time of production by another filter. In FIG. 3, for the first input window, the first state estimate generated by filter 206-8-1 is selected by the multiplexer 206-4 to apply to the data register 206-5. For the second input window, the second state estimate generated by filter 206-8-2 is selected by multiplexer 206-4. For the third input window, the third state estimate generated by filter 206-8-3 is selected by multiplexer 206-4. For the fourth input window, the fourth state estimate produced by filter 206-8-4 is selected by multiplexer 206-5. It should be apparent that for the fifth, sixth, seventh and eighth windows, the state estimates from the filters 206-8-1, 206-8-2, 206-8-3 and 206-8-4, respectively, are selected by the multiplexer 206-4. So long as $T_{be}$ equals five cycles and $T_f$, the filter update time, equals four cycles, the multiplexer 206-4 sequentially selects state estimates from the filters in the following repetitive order: filter 206-8-1, filter 206-8-2, filter 206-8-3 and filter 206-8-4. At each of the windows shown in FIG. 3, a filter will do at least the following two things: 1) read state information from the sensor to be used in generating a state estimate a time $T_f$ later; and 2) make a state estimate available using state measurement information received from the sensor at earlier times.

In FIG. 4, the exposure cycle time has been changed to three cycles whereas $T_f$ still equals four cycles. The multiplexer 206-4 sequentially selects state estimates from the filters in the following repetitive order: filter 206-8-1, filter 206-8-4, filter 206-8-3 and filter 206-8-2.

In FIG. 5, the exposure cycle time has been changed to six cycles whereas $T_f$ still equals four cycles. The multiplexer 206-4 sequentially selects state estimates only from filters 206-8-1 and 206-8-3 in the following repetitive order: filter 206-8-1 followed by filter 206-8-3. In this case, only two filters are required; filters 206-8-2 and 206-8-4 are never selected.

System 200 has been described in connection with four filters. However, there can be more or fewer filters depending on the allowable length of the exposure cycle time as well as the minimum length of the filter update time. The number of filters can be calculated using the following equation:

Number of filters=maximum of $\{(T_f/T_{be})*n$, for all allowable $T_{be}\}$, where n is the smallest integer that will result in an integer value for $(T_f/T_{be})*n$, $T_f$ is the filter update time and $T_{be}$ is the period of the secondary process (i.e., the period of the process that requires the filter output).

Figure 6:
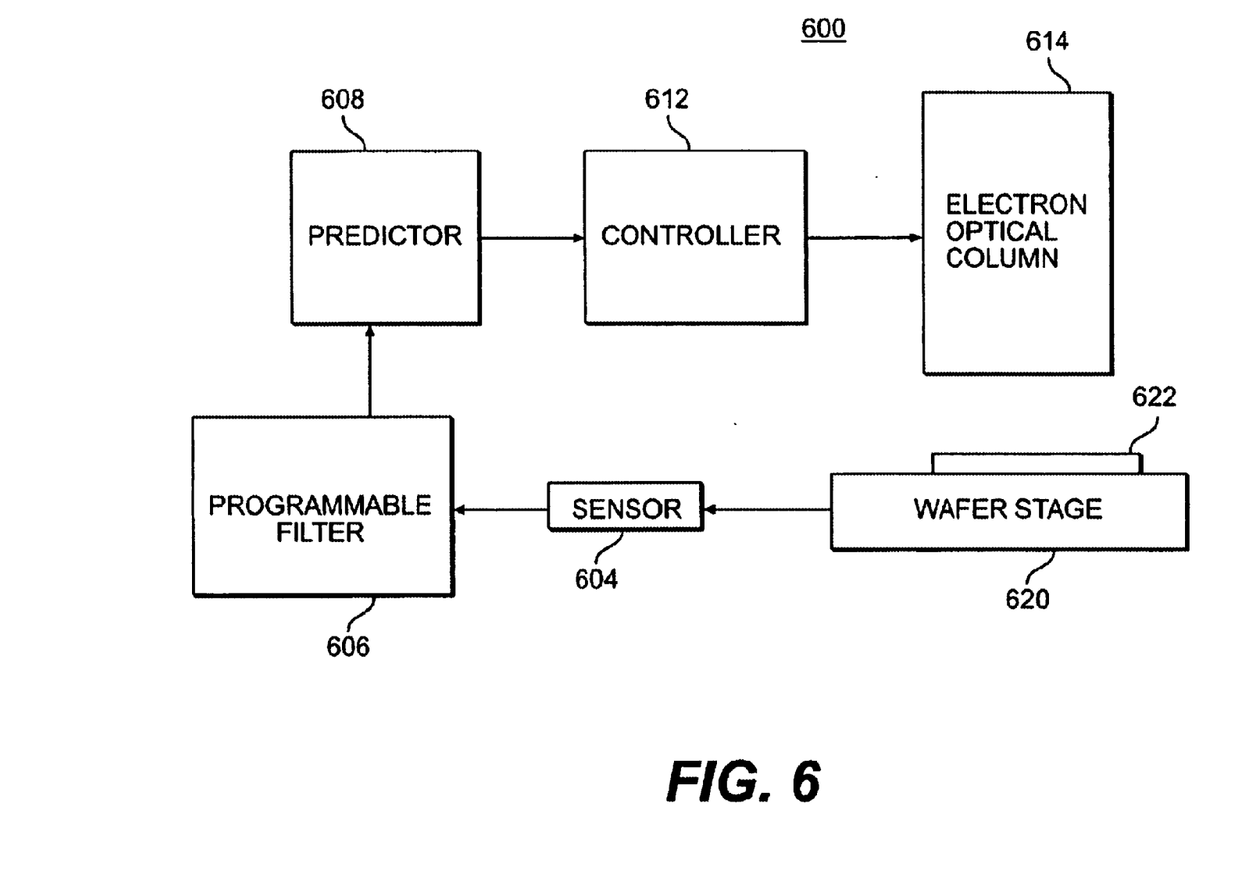
FIG. 6 is a block diagram of a filter architecture according to an alternate embodiment of the invention.

FIG. 6 shows an illustrative system block diagram of an alternative lithography system (System) 600 according to the presently preferred embodiment of the invention. The system 600 includes a moving wafer stage assembly 620 and an electron optical column 614 that projects electrons onto a wafer 622 placed on the wafer stage assembly 620. The system 600 also includes a sensor 604 that detects the position of a reticle stage assembly 602. The sensor 604 is coupled to a programmable filter 606 through a sampling circuit (not shown) and possibly an analog-to-digital converter (not shown). The programmable filter 606 is coupled to a predictor 608 that in turn is coupled to a controller 612 that in turn is coupled to the electron optical column 614. Instead of having many fixed filter update time filters from which filtered samples may be selected in order to provide state estimates, the filter update time of programmable filter 606 can be changed such that the filter 606 produces a state estimate at least as often as the controller 612 requires an estimate.

The programmable filter 606 can be used where it is known a priori that all allowable values of the exposure cycle time $T_{be}$ of the secondary process (or the controller 612) will always be longer than the filter update time of the filter 606. More specifically, if the exposure cycle time is known to be fixed over a certain time period and it is known when it will change and to what value it will change, a programmable filter as in the system 600 can be used so long as, for each value of the exposure cycle time, the exposure cycle is an integer multiple of the programmable filter update time. For a filter that accepts state measurement samples with the same frequency as the filter update frequency, a short filter update time ensures predictions based on more recent measurements than would be the case for a filter with a longer update time. Thus, it is usually desirable to make the filter update time an integer submultiple of the exposure cycle time. Other types of filters that accept state measurement samples more frequently may function effectively with a filter update time equal to the exposure cycle time.

In the present embodiment of the invention, the exposure cycle time includes a blanking time and an exposure time. The blanking time $T_b$ is the input window during which the secondary process (or the controller 612) can accept a state estimate. The exposure time is the time during which the controller 612 cannot accept a state estimate and is equal to $T_{be}-T_b$. The exposure time is determined by the electron beam intensity and the wafer resist properties. For some values of the exposure cycle time, it may be necessary to change the blanking time so that the value of the exposure cycle time after adjusting the blanking time is an integer multiple of the filter update time. This will usually be the case when $T_{be}$ is equal to the clock cycle multiplied by a prime number. For some values of the exposure cycle time, it may be necessary to change the filter update time to a value larger than the minimum filter update time, so that the exposure cycle time is an integer multiple of the filter update time. Table 1.1 below shows how the filter update time (or blanking time, or both) are adjusted for various operating conditions. $T_{fm}$ is the minimum filter update time and depends on the available computational resources and the complexity of the filter algorithm.

TABLE 1.1

| $T_{fm}$ (min.) | $T_{be}$ (before) | $T_f$ (after) | $T_{be}$ (after) |
|---|---|---|---|
| 5 cycles | 6 cycles | 6 cycles | 6 cycles |
| 5 cycles | 14 cycles | 7 cycles | 14 cycles |
| 5 cycles | 18 cycles | 6 cycles | 18 cycles |
| 5 cycles | 19 cycles | 5 cycles | 20 cycles |
| 5 cycles | 23 cycles | 6 cycles | 24 cycles |

Figure 7A:
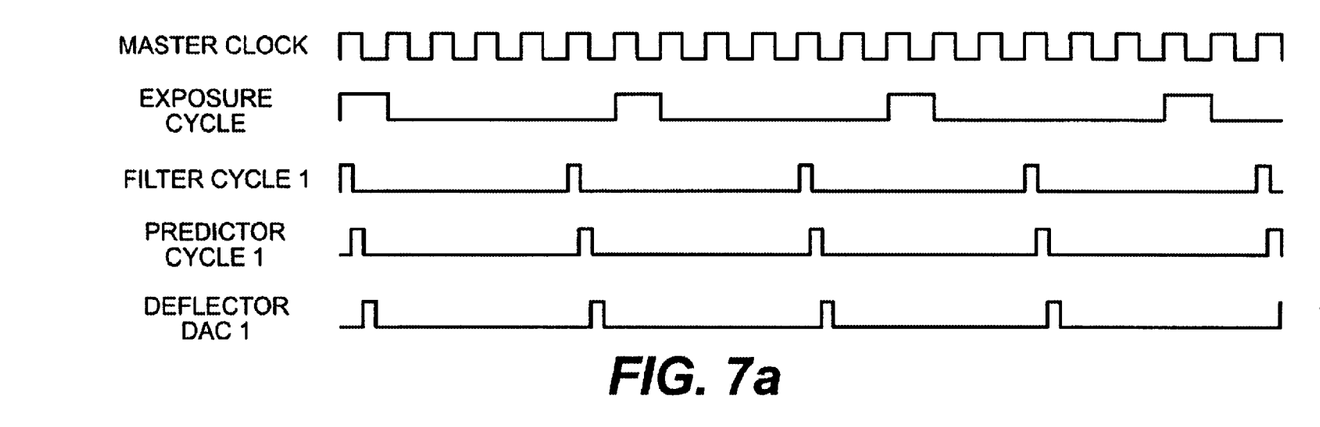
FIG. 7 is a timing diagram of the operation of a filter architecture according to the embodiment of FIG. 6.
Figure 7B:
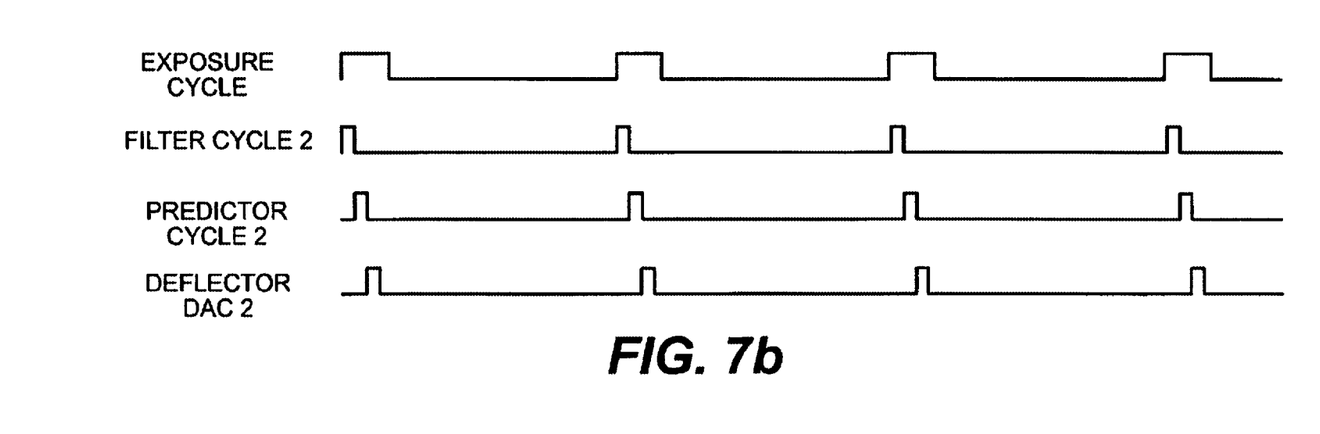
Figure 8A:
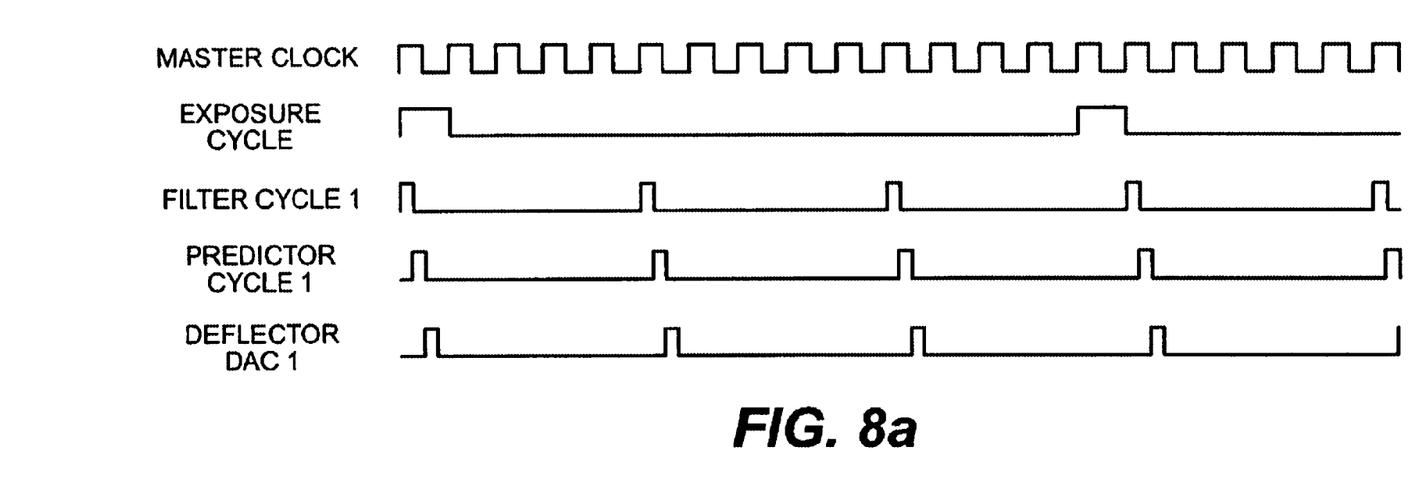
FIG. 8 is a timing diagram of the operation of a filter architecture according to the embodiment of FIG. 6.
Figure 8B:
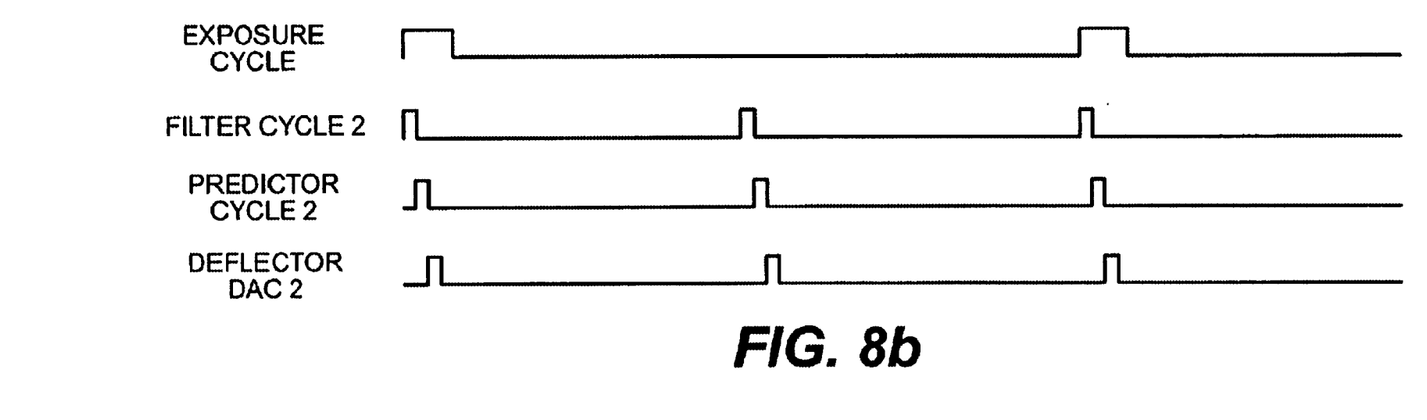

A representative depiction of the operation of the system 600 is shown in the timing diagrams of FIGS. 7a, 7b, 8a, 8b, 9a and 9b. In FIG. 7a, the prescribed time interval or exposure cycle time is six cycles long. The programmable filter 606 initially has a filter update time of five cycles. The filter 606 can be reprogrammed to produce state estimates every six cycles as depicted in FIG. 7b. Reprogramming the filter 606 includes changing the parameters of the Kalman filter to account for the changed update time. Reprogramming of Kalman filters is well known in the art. Timing diagrams representative of another operating situation are shown in FIGS. 8a and 8b, where the exposure cycle time is fourteen cycles. To produce a state estimate when the secondary process can accept it, the filter 606 is reprogrammed such that the filter update time is increased from five cycles to seven cycles.

Figure 9A:
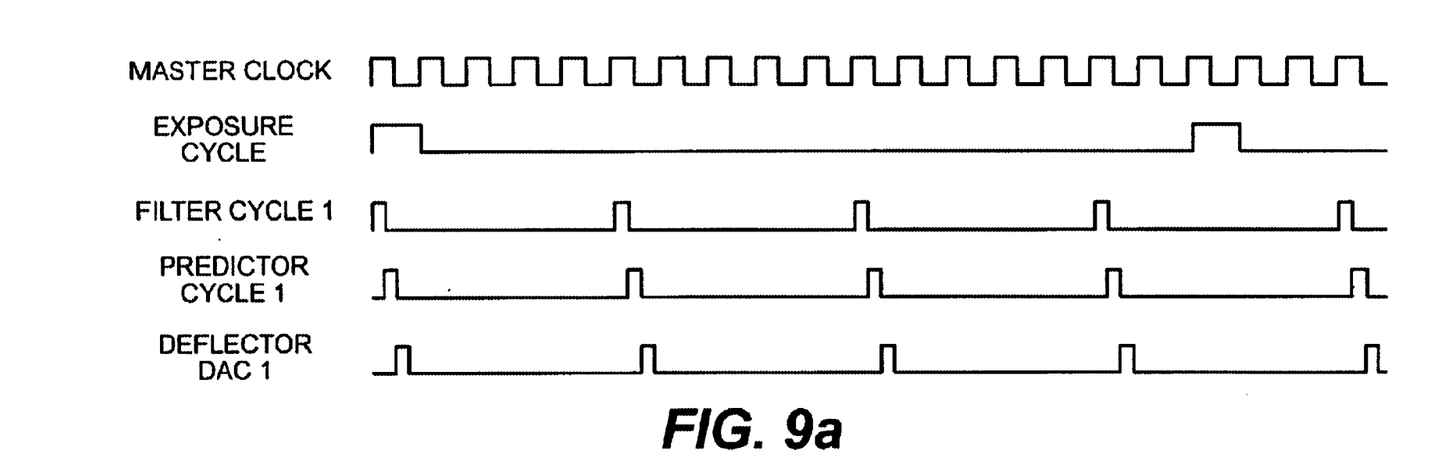
FIG. 9 is a timing diagram of the operation of a filter architecture according to the embodiment of FIG. 6.
Figure 9B:
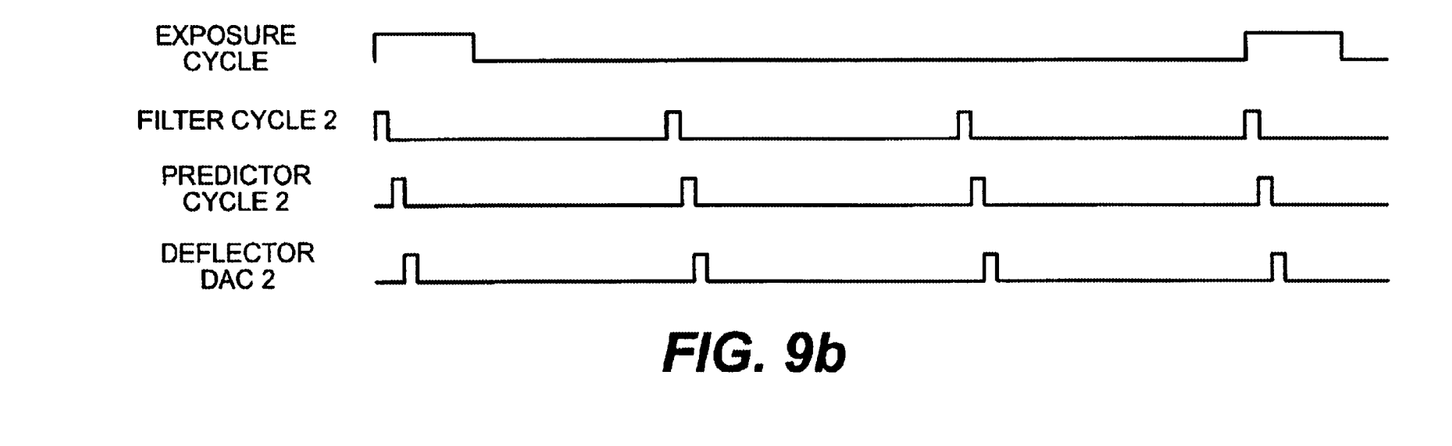

Timing diagrams representative of another operating situation are shown in FIGS. 9a and 9b, where the exposure cycle time is seventeen cycles long. Since the number of cycles in the exposure cycle time is a prime number, changing the filter update time by itself is not sufficient to make the exposure cycle time an integer multiple of the filter update time. Consequently, the blanking time $T_b$ is increased as illustrated in FIG. 9b. As a result, the exposure cycle time is now eighteen cycles. Concomitantly, the filter update time has been increased by one cycle to six cycles so that the exposure cycle time is an integer multiple of the filter update period.

Figure 10:
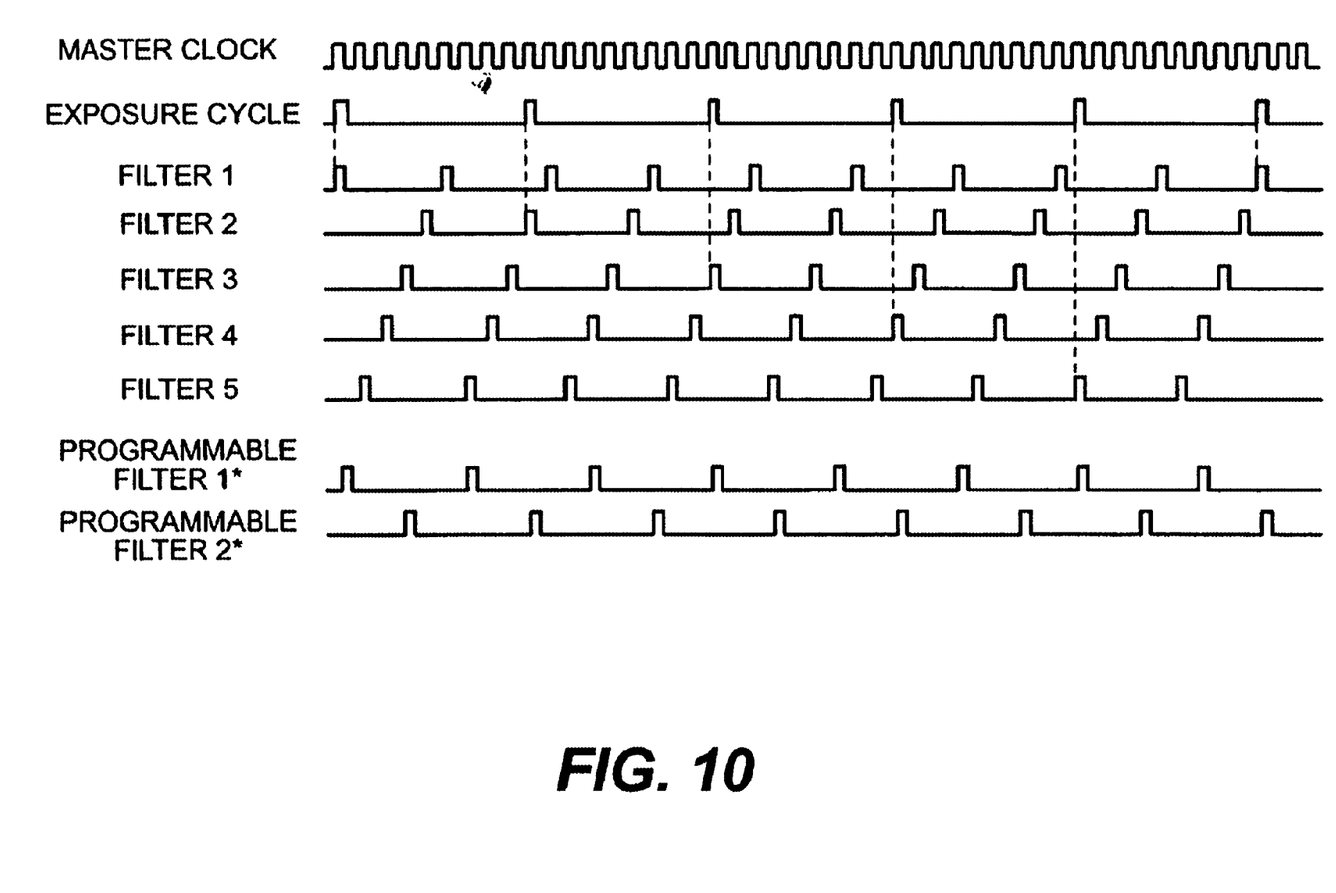
FIG. 10 is a timing diagram of the operation of a filter architecture having multiple programmable filters.

FIG. 10 illustrates the timing diagram for a system similar to the system 200, but which has programmable filters instead of filters with a fixed filter update time. Instead of having many filters with a fixed filter update time from which filtered samples may be selected in order to provide state estimates, a programmable filter permits changing the filter update time to match the needs of a secondary process for a state estimate. For an exposure cycle time of nine cycles, and a $T_f$ of five cycles, five non-programmable filters are needed to produce a state estimate whenever the secondary process can accept one. The five filters can be reduced to two filters if the two filters can be programmed so as to have a filter update time of six cycles.

Alternatively, a single programmable filter having a filter update time of five cycles can be used, if the exposure cycle time is increased to ten cycles. However this requires increasing the total blanking time, as is also the case in FIG. 9b. Since an increase in blanking time reduces the system throughput, this approach should be avoided if possible.

As mentioned earlier for the first embodiment, the total exposure time may exceed the period over which the predictions from the filter-predictor are valid. In that case, extra blanking periods may be inserted during the exposure time, so that predictor updates can be made without disturbing the analog output of the deflector drivers. Thus, these extra blanking periods should coincide with updates from the filter-predictor(s). If possible, the filter update time should be adjusted to be an integer sub-multiple of the new total exposure time, using the methods described above. If the new total exposure time, after inclusion of extra blanking periods, is $T_{be}'$, the following relationship should preferably be satisfied: $N_u T_f = T_{be}' = T_{be} + (N_u-1)T_b$, where $N_u$ is the number of update times during the new exposure cycle. In order to maximize the system throughput, the total blanking time should be as small as possible. Thus, $T_f$ should be as long as possible, consistent with the required prediction accuracy, and $N_u$ should be as small as possible.

If it is not possible to find integers satisfying this relationship, a longer blanking time may be added for the last filter-predictor update so that $T_{be}'$ becomes an integer multiple of $T_f$. That is, if $N_u$ is the largest integer satisfying the relationship $N_u T_f < T_{be} + (N_u-1)T_b$, a final blanking period $T_b'$ of duration $T_b' = (N_u+1) T_f - T_{be} - (N_u-1)T_b$ will provide an exposure cycle $T_{be}'$ equal to $T_f$ multiplied by the integer $N_u+1$.

The benefits of using a programmable filter include flexibility and reduction in the number of filters required in an application. Where possible, it may be preferable to have only one DSP chip running one filter instead of a staggered filter structure where several DSP chips are running several filters staggered in time.

Although the invention has been described in conjunction with particular embodiments, it will be appreciated that various modifications and alterations may be made by those skilled in the art without departing from the spirit and scope of the invention. The invention is not to be limited by the foregoing illustrative details, but rather is to be defined by the appended claims.

What is claimed is:

1. A method of producing variable rate filtered samples for use as data in a secondary process that has prescribed time intervals during which filtered samples are required, comprising:

producing multiple respective periodic sequences of filtered samples each having a same sample period, wherein each respective sequence can provide a different filtered sample during each sample period and the respective sequences are offset in time with respect to one another so that no filtered sample from any sequence overlaps with any filtered sample from any other sequence; and selecting from among the respective sequences filtered samples that coincide with the timing requirements of the secondary process.

2. The method of claim 1, wherein selecting is done from at least one of the respective sequences.

3. The method of claim 1, wherein selecting is done from at least two of the respective sequences.

4. The method of claim 1, wherein selecting is done from at least three of the respective sequences.

5. The method of claim 1, wherein selecting is done from at least four of the respective sequences.

6. The method of claim 1, wherein selecting is performed sequentially and periodically from at least two of the respective sequences.

7. The method of claim 1, wherein:

each respective sequence has a same filter sampling time;

selecting is performed every prescribed time interval; and the same filter sampling time is less than the prescribed time interval.

8. The method of claim 1, wherein the sequences have a quantity equal to a value governed by the expression: value=maximum of $\{(T_f/T_{be})*n,$ for all allowable $T_{be}\}$, where n is a smallest integer that will result in an integer value for $(T_f/T_{be})*n$, $T_f$ is a filter sampling time and $T_{be}$ is a prescribed time interval.

9. The method of claim 8, wherein selecting is performed every prescribed time interval, further comprising changing the prescribed time interval $T_{be}$.

10. The method of claim 1, wherein selecting is performed every prescribed time interval, further comprising changing the prescribed time interval $T_{be}$, wherein the prescribed time interval $T_{be}$ comprises a blanking time $T_b$ and an exposure time $T_e$ and changing the prescribed time interval $T_{be}$, comprises increasing the exposure time $T_e$.

11. A method of generating at a variable rate a filtered output using a synchronous filter, wherein the filtered output is accepted periodically by a secondary process with a secondary process period $T_{be}$ and the synchronous filter generates the filtered output with a filter sampling time $T_f$, comprising:

changing the filter sampling time $T_f$ of the synchronous filter such that the synchronous filter generates the filtered output when the secondary process is able to periodically accept the filtered output;

accepting a sensor sample by the synchronous filter;

generating the filtered output from the synchronous filter using the sensor sample; and accepting the filtered output by the secondary process.

12. The method of claim 11, wherein the synchronous filter also generates the filtered output when the secondary process is unable to periodically accept the filtered output.

13. A method of generating at a variable rate a filtered output using a synchronous filter, wherein the filtered output is accepted periodically by a secondary process with a secondary process period $T_{be}$ and the synchronous filter generates the filtered output with a filter sampling time $T_f$, comprising:

increasing the secondary process period $T_{be}$ by an amount such that the secondary process is able to periodically accept the filtered output at substantially the same time the synchronous filter produces the filtered output;

accepting a sensor sample by the synchronous filter;

generating the filtered output from the synchronous filter using the sensor sample; and accepting the filtered output by the secondary process.

14. The method of claim 13, wherein the synchronous filter also generates the filtered output when the secondary process is unable to periodically accept the filtered output.

15. A system for use with a secondary process that requires different filtered samples during each of a sequence of input window time intervals, and for providing filtered electronic signal samples, comprising:

multiple filtered sample lines;

multiple filters, each periodically receiving a sample of a signal; wherein:
   each filter periodically provides its filtered sample sequence to a filtered sample line with a respective filter sampling time $T_f$, and
   the respective filtered sample sequences are offset in time with respect to one another so that no filtered sample from any filtered sample sequence overlaps with any filtered sample from any other filtered sample sequence;

a multiplexer responsive to control signals and coupled to each of the multiple filtered sample lines; wherein:
   the multiplexer accepts the respective periodic filtered output of each of the multiple filters, and
   the multiplexer has a multiplexer output; and control logic providing control signals causing the multiplexer to:
   select from among the filtered sample lines in a sequence results in respective coincidences of respective filtered samples on respective selected filtered sample lines and respective input sample windows for the secondary process, and
   sequentially provide respective filtered samples on respective selected lines as a sequence of filtered input for use by the secondary process.

16. The system of claim 15, wherein the sequence of filtered input is produced using less than all of the respective filtered sample sequences accepted by the multiplexer.

17. The system of claim 15, further comprising a sensor that generates the signal.

18. The system of claim 17, further comprising an analog-to-digital converter that periodically generates the sample of the signal.

19. The system of claim 18, wherein the sample is indicative of a position of a stage assembly.

20. The system of claim 19, wherein the stage assembly positions at least one reticle.

21. The system of claim 19, wherein the stage assembly positions at least one wafer.

22. The system of claim 15, wherein:
   the secondary process has a prescribed time interval $T_{be}$ by which the input sample windows are spaced; and
   the prescribed time interval $T_{be}$ is less than the filter sampling time $T_f$.

23. The system of claim 15, wherein:
   the multiple filters are programmable filters; and
   the respective filter sampling time of each programmable filter can be changed.

24. The system of claim 15, wherein:
   the secondary process has a prescribed time interval $T_{be}$ by which the input sample windows are spaced;
   the prescribed time interval $T_{be}$ has multiple allowable values; and
   the multiple filters have a quantity equal to a value governed by an expression:

$$\text{value} = \{\text{maximum of } (T_f/T_{be})*n, \text{ for all allowable } T_{be}\},$$

where n is a smallest integer that will result in an integer value for $(T_f/T_{be})*n$.

25. A lithography source control system comprising:

a sensor generating a signal;

multiple filters each periodically accepting a sample of the signal and producing a respective periodic filtered output with a filter sampling time $T_f$;

a multiplexer having a multiplexer output and accepting the respective periodic filtered output of each of the multiple filters;

control logic controlling the multiplexer such that the multiplexer output produces an output sequence of the respective periodic filtered output accepted by the multiplexer; and a lithography source that is controlled using the output sequence.

26. The system of claim 25, wherein the output sequence is produced using less than all of the respective periodic filtered outputs accepted by the multiplexer.

27. The system of claim 25, wherein a prescribed time interval $T_{be}$ is less than the filter sampling time $T_f$.

28. The system of claim 25, wherein:
   the multiple synchronous filters have a quantity;
   the sequence is a periodic sequence with a prescribed time interval $T_{be}$ having multiple allowable values; and
   the quantity is equal to a value governed by an expression:

$$\text{value} = \text{maximum of } \{(T_f/T_{be})*n, \text{ for all allowable } T_{be}\},$$

where n is a smallest integer that will result in an integer value for $(T_f/T_{be})*n$.

* * * * *